United States Patent
Lazzari et al.

(10) Patent No.: US 9,224,807 B2
(45) Date of Patent: Dec. 29, 2015

(54) ARRAYS OF SILICON STRUCTURES INCLUDING METAL SILICIDE REGIONS, AND RELATED SEMICONDUCTOR DEVICE STRUCTURES

(71) Applicant: Micron Technology, Inc., Boise, ID (US)

(72) Inventors: Carla M. Lazzari, Casatenovo (IT); Enrico Bellandi, Agrate Brianza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/199,519

(22) Filed: Mar. 6, 2014

(65) Prior Publication Data
US 2014/0183703 A1    Jul. 3, 2014

Related U.S. Application Data

(62) Division of application No. 13/400,920, filed on Feb. 21, 2012, now Pat. No. 8,692,373.

(51) Int. Cl.
| | |
|---|---|
| *H01L 29/06* | (2006.01) |
| *H01L 21/285* | (2006.01) |
| *H01L 27/24* | (2006.01) |

(52) U.S. Cl.
CPC ...... *H01L 29/0657* (2013.01); *H01L 21/28518* (2013.01); *H01L 27/2445* (2013.01)

(58) Field of Classification Search
CPC ............... H01L 2924/00; H01L 2924/00014; H01L 2924/1305; H01L 2224/73265; H01L 2924/10253; H01L 29/0657; H01L 29/06
USPC .......... 257/754, 330, 331, 382, 328
See application file for complete search history.

(56) References Cited

U.S. PATENT DOCUMENTS

| | | | |
|---|---|---|---|
| 4,984,037 A * | 1/1991 | Ditchek et al. ............ 257/267 |
| 5,211,707 A * | 5/1993 | Ditchek et al. ............ 438/20 |
| 5,567,651 A | 10/1996 | Berti et al. |
| 6,103,610 A | 8/2000 | Blair et al. |
| 6,136,705 A | 10/2000 | Blair et al. |
| 6,329,276 B1 | 12/2001 | Ku et al. |
| 6,380,040 B1 | 4/2002 | Kepler et al. |
| 6,635,539 B2 | 10/2003 | Kwon et al. |
| 6,936,528 B2 | 8/2005 | Koo et al. |
| 2004/0124461 A1 | 7/2004 | Gajda |
| 2006/0192249 A1 | 8/2006 | Kim et al. |
| 2007/0170498 A1 | 7/2007 | Hu et al. |
| 2007/0187751 A1 | 8/2007 | Hu et al. |
| 2008/0144354 A1* | 6/2008 | Choi et al. ............ 365/148 |
| 2009/0176342 A1 | 7/2009 | Lee et al. |

(Continued)

*Primary Examiner* — Chuong A Luu
*Assistant Examiner* — Rodolfo Fortich
(74) *Attorney, Agent, or Firm* — TraskBritt

(57) ABSTRACT

A method of forming a metal silicide region. The method comprises forming a metal material over and in contact with exposed surfaces of a dielectric material and silicon structures protruding from the dielectric material. A capping material is formed over and in contact with the metal material. The silicon structures are exposed to heat to effectuate a multidirectional diffusion of the metal material into the silicon structures to form a first metal silicide material. The capping material and unreacted portions of the metal material are removed. The silicon structures are exposed to heat to substantially convert the first metal silicide material into a second metal silicide material. A method of semiconductor device fabrication, an array of silicon structures, and a semiconductor device structure are also described.

17 Claims, 13 Drawing Sheets

(56) References Cited

U.S. PATENT DOCUMENTS

| | | |
|---|---|---|
| 2011/0001114 A1 | 1/2011 | Zanderighi et al. |
| 2011/0073925 A1* | 3/2011 | Park et al. .................... 257/306 |
| 2011/0233503 A1 | 9/2011 | Hwang |
| 2013/0214417 A1 | 8/2013 | Lazzari et al. |

\* cited by examiner

ARRAYS OF SILICON STRUCTURES INCLUDING METAL SILICIDE REGIONS, AND RELATED SEMICONDUCTOR DEVICE STRUCTURES

CROSS-REFERENCE TO RELATED APPLICATION

This application is a divisional of U.S. patent application Ser. No. 13/400,920, filed Feb. 21, 2012, now U.S. Pat. No. 8,692,373, issued Apr. 8, 2014, the disclosure of which is hereby incorporated herein in its entirety by this reference.

TECHNICAL FIELD

Embodiments of the present disclosure relate to methods of forming a metal silicide region on at least one silicon structure, and to a related array of silicon structures, and to a related semiconductor device structure.

BACKGROUND

Metal silicides have been employed in a variety of silicon structures as a way of reducing contact resistance. For example, various metal silicides can be employed as low resistance contact regions between bipolar junction transistors (BJTs) and phase change memory (PCM) cells. The memory element of a conventional PCM cell includes a chalcogenide material that can switch states (e.g., between crystalline, semi-crystalline, amorphous, and semi-amorphous states) upon changes in temperature. A BJT can enable the changes in temperature by selectively supplying or stopping current to an electrode of the PCM cell. A metal silicide contact region at the interface of the BJT and the electrode can decrease electrical resistance between the BJT and the electrode, reducing voltage requirements and improving an ability to switch the states of the chalcogenide material.

An example of a metal silicide frequently used to form a low resistance contact region of a BJT is cobalt disilicide ($CoSi_2$). $CoSi_2$ advantageously exhibits relatively low electrical resistance (e.g., from about 16 micro-ohm-centimeters to about 18 micro-ohm-centimeters), generally does not form tightly bound compounds with common p-type and n-type dopants, and forms a smooth and fine-grained silicide. However, overgrowth-related problems (e.g., increased electrical resistance, current leakage, etc.) caused by the deficiencies of conventional methods of forming $CoSi_2$ contact regions have limited the formation of $CoSi_2$ contact regions to silicon structures having relatively large critical dimensions, such as areas larger than about 3600 $nm^2$.

It would, therefore, be desirable to have an improved method of forming a metal silicide region, such as a $CoSi_2$ contact region, that facilitates the formation of the metal silicide region confined within the critical dimensions of a smaller silicon structure, such as within an area of less than or equal to about 3600 $nm^2$. It would be further desirable for such a method to provide improved control of the uniformity of the metal silicide region formed.

DETAILED DESCRIPTION

Figure 1A:
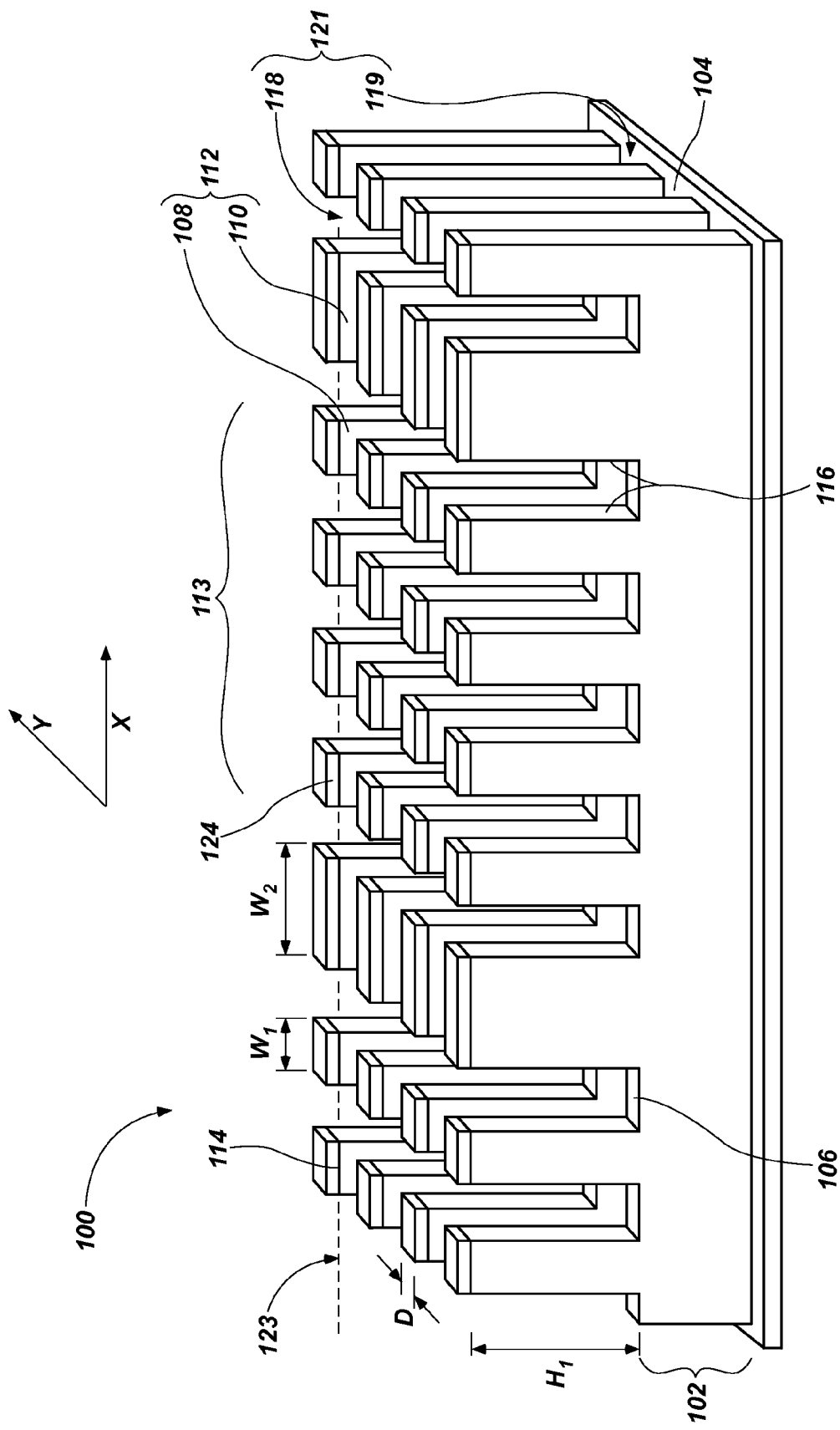
FIGS. 1A through 1G illustrate an embodiment of a method of the present disclosure for forming a metal silicide region for at least one silicon structure.

The present disclosure relates to methods of forming a metal silicide region on at least one silicon structure, to a related array of silicon structures, and to a related semiconductor device structure. The metal silicide region is formed by the self-aligned silicidation (also known as a "salicidiation") of a metal material and silicon. By tailoring the morphology, which may also be characterized as the geometry, of the metal material and adjacent silicon, the resulting metal silicide region on the silicon structure may be confined to a small area (i.e., having dimensions of less than about 60 nm by about 60 nm). The methods of forming a metal silicide region for at least one silicon structure disclosed herein may overcome difficulties with conventional methods of forming a metal silicide region (e.g., difficulties with overgrowth of metal silicide caused by the deficiencies in controlling the diffusion of metal material during silicidation processes), thus improving the compositional uniformity and the thickness uniformity of the metal silicide region formed, and enabling the formation of smaller metal silicide regions than have previously been available in the semiconductor industry.

In some embodiments, the metal silicide region may be formed by forming an array of silicon structures separated by isolation trenches. The silicon structures may be, for example, silicon pillars. The isolation trenches are filled with a dielectric material such that the dielectric material abuts and substantially covers sidewalls of each of the silicon structures. The dielectric material in the isolation trenches forms isolation regions surrounding the silicon structures. A portion of the dielectric material is selectively removed to expose a portion of the sidewalls of each of the silicon structures and form a height differential between a top surface of each of the silicon structures and a top surface of the dielectric material. A metal material may be formed over and in contact with the top surface of the dielectric material, the top surface of each of the silicon structures, and the exposed portion of the sidewalls of each of the silicon structures. A capping material may be faulted over and in contact with the metal material. The array of silicon structures is subjected to a first thermal treatment to effectuate a multidirectional diffusion of the metal material into each of the silicon structures (e.g., longitudinal diffusion from the metal material on the top surface of each of the silicon structures and lateral diffusion from the metal material on the exposed portion of the sidewalls of each of the silicon structures) and form a first metal silicide material. The capping material and unreacted portions of the metal material are selectively removed, and the array of silicon structures is subjected to a second thermal treatment. The second thermal treatment may convert the first metal silicide material to a second metal silicide material, completing formation of the metal silicide regions. By way of example and not limitation, the metal silicide regions may function as contact regions for the silicon structures. In one embodiment, the metal silicide regions are contact regions for vertical BJTs. As used herein, the term "contact region" means and includes an electrical contact region facilitating a conductive pathway between at least two structures.

As used herein, the term "silicidation" means and includes a reaction between silicon and a metal material, such as cobalt (Co), nickel (Ni), palladium (Pd), platinum (Pt), titanium (Ti), zirconium (Zr), hafnium (Hf), vanadium (V), niobium (Nb), tantalum (Ta), molybdenum (Mo), tungsten (W), or alloys thereof, to form an alloy (i.e., metal silicide) of the silicon and the metal material.

As used herein, the term "silicon" means and includes a material that includes the element silicon or a compound of silicon. The silicon may be a conventional silicon wafer or other bulk substrate comprising a layer of silicon. The silicon may include monocrystalline silicon, polysilicon, or combinations thereof, which may be doped or undoped. The silicon may have any crystal orientation.

As used herein, relational terms, such as "first," "second," "over," "top," "bottom," "underlying," etc., are used for clarity and convenience in understanding the disclosure and accompanying drawings and do not connote or depend on any specific preference, orientation, or order, except where the context clearly indicates otherwise.

The following description provides specific details, such as material types, material thicknesses, and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. The semiconductor structures described below do not form a complete semiconductor device. Only those process acts and structures necessary to understand the embodiments of the present disclosure are described in detail below. Additional acts to form a complete semiconductor device from the silicon structures may be performed by conventional fabrication techniques. Also note, any drawings accompanying the present application are for illustrative purposes only, and are thus not drawn to scale. Additionally, elements common between figures may retain the same numerical designation.

FIGS. 1A through 1G, are simplified perspective (FIG. 1A) and partial cross-sectional (FIGS. 1B through 1G; taken about an X direction shown in FIG. 1A) views illustrating embodiments of a method of forming a metal silicide region on at least one silicon structure, such as a metal silicide contact region for at least one vertical BJT. With the description as provided below, it will be readily apparent to one of ordinary skill in the art that the process described herein may be used in various applications. In other words, the process may be used whenever it is desired to form a metal silicide region for at least one silicon structure.

Figure 1B:
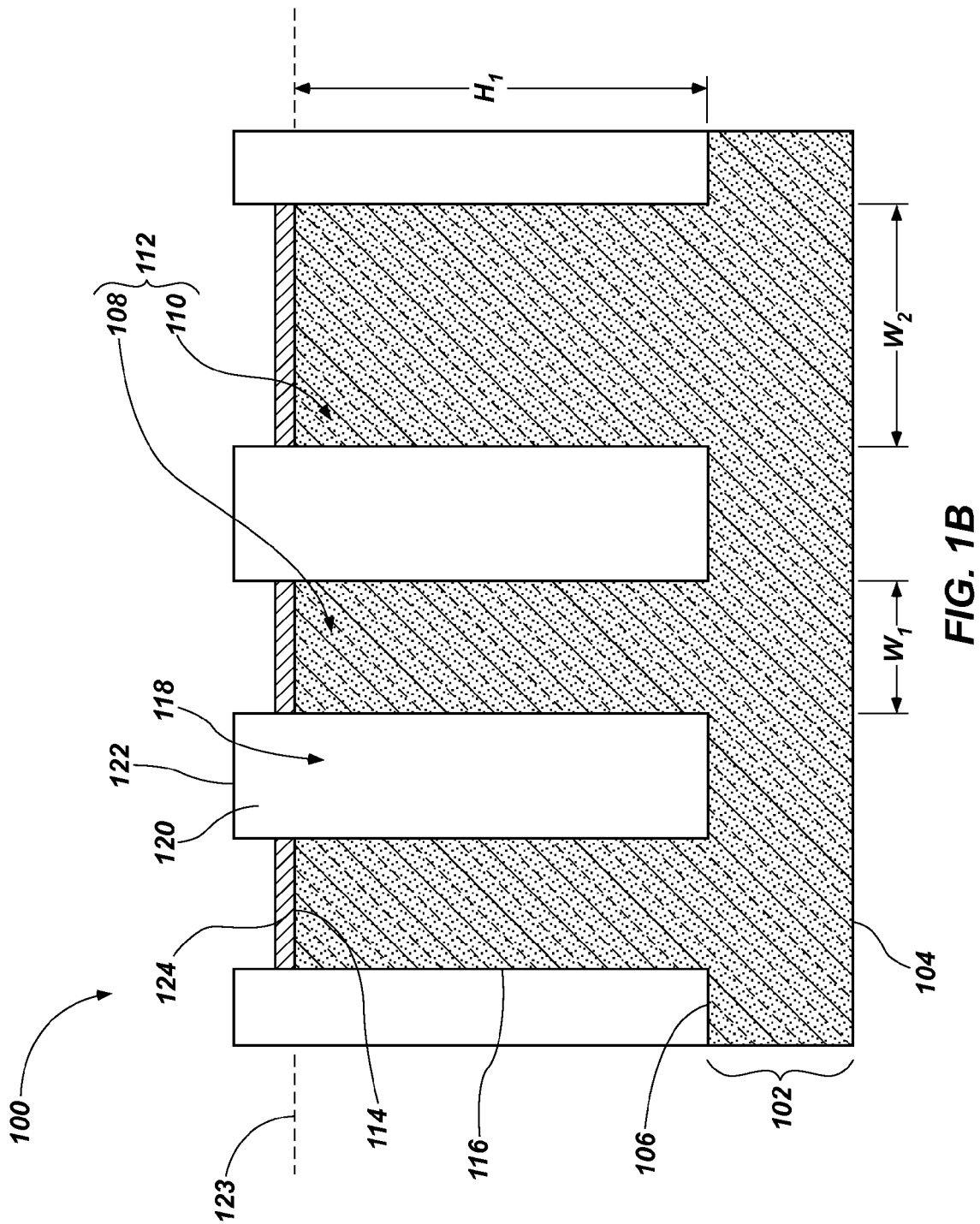

Referring to FIG. 1A, an array of silicon structures 100 may include a silicon base 102, silicon structures 112 (e.g., silicon pillars), isolation trenches 121 filled with a dielectric material 120 (see FIG. 1B, illustrating the dielectric material 120 within first isolation trenches 118 of the isolation trenches 121 shown in FIG. 1A; the dielectric material 120 absent from FIG. 1A for clarity), and a screen material 124.

The silicon structures 112 may longitudinally extend from and be integral with the silicon base 102. As used herein, each of the terms "longitudinal" and "vertical" means and includes extending in a direction substantially perpendicular to the silicon base 102, regardless of the orientation of the silicon base 102. As used herein, each of the terms "lateral" and "horizontal" means and includes extending in a direction substantially parallel to the silicon base 102, regardless of the orientation of the silicon base 102. The silicon structures 112 may be separated from one another by the isolation trenches 121 such that the dielectric material 120 (see FIG. 1B, as described above) abuts and substantially covers sidewalls 116 of each of the silicon structures 112. The screen material 124 may be disposed over and in contact with a top surface 114 of each of the silicon structures 112. While various embodiments herein describe the array of silicon structures 100 as including silicon structures 112 (i.e., more than one silicon structure 112), the array of silicon structures 100 may, alternatively, include a single silicon structure 112.

As shown in FIG. 1A, the array of silicon structures 100 may include rows of the silicon structures 112 extending in an X direction and columns of the silicon structures 112 extending in a Y direction. The X direction may be substantially perpendicular to the Y direction. The silicon structures 112 may include small silicon structures 108 and large silicon structures 110. Each of the rows may include a portion of the small silicon structures 108 and a portion of the large silicon structures 110. Within each of the rows, groups 113 of the small silicon structures 108 may be separated by at least one of the large silicon structures 110. As a non-limiting example, a group of four of the small silicon structures 108 may be separated from another group of four of the small silicon structures 108 by one of the large silicon structures 110. The number of small silicon structures 108 in each of the groups 113 of the small silicon structures 108 may be varied as desired. As illustrated in FIG. 1A, the isolation trenches 121 may include first isolation trenches 118 and second isolation trenches 119. The first isolation trenches 118 may separate each of the silicon structures 112 (e.g., each of the small silicon structures 108 and each of the large silicon structures 110) within each of the rows. The first isolation trenches 118 may longitudinally extend to a top surface 106 of the silicon base 102. Each of the columns may include a portion of the small silicon structures 108 or may include a portion of the large silicon structures 110. The second isolation trenches 119 may separate each of the silicon structures 112 (e.g., each of the small silicon structures 108 or each of the large silicon structures 110) within each of the columns. The second isolation trenches 119 may longitudinally extend to a bottom surface 104 of the silicon base 102. The second isolation trenches 119 may extend substantially perpendicular to the first isolation trenches 118.

As depicted in FIG. 1A, the silicon structures 112 (i.e., the small silicon structures 108 and the large silicon structures 110) may be of substantially equal height $H_1$ and substantially equal depth D. The height $H_1$ of each of the silicon structures 112 may be within a range of from about 50 nanometers (nm) to about 400 nm, such as from about 80 nm to about 350 nm, or from about 100 nm to about 300 nm. In at least some embodiments, the height $H_1$ is about 295 nm. The depth D of each of the silicon structures 112 may be less than or equal to about 60 nm, such as less than or equal to about 52 nm, or less than or equal to about 32 nm, or less than or equal to about 25 nm. In at least some embodiments, the depth D of each of the silicon structures 112 is about 52 nm. In addition, at least some of the silicon structures 112 may have a substantially different width than at least some other of the silicon structures 112. For example, as shown in FIG. 1A, a width $W_1$ of each of the small silicon structures 108 may be smaller than a width $W_2$ of each of the large silicon structures 110. The width $W_1$ of each of the small silicon structures 108 may be less than or equal to about 60 nanometers (nm), such as less than or equal to about 52 nm, or less than or equal to about 32 nm, or less than or equal to about 25 nm. In at least some embodiments, the width $W_1$ of each of the small silicon structures 108 is about 52 nm. The width $W_2$ of each of the large silicon structures 110 may be greater than the width $W_1$ of each of the small silicon structures 108. By way of non-limiting example, a ratio between the width $W_1$ of each of the small silicon structures 108 and the width $W_2$ of each of the large silicon structures 110 may be within a range of from about 1:1.5 to about 1:3.0, such as from about 1:2.0 to about 1:2.5. In at least some embodiments, the ratio between the width $W_1$ of each of the small silicon structures 108 and the width $W_2$ of each of the large silicon structures 110 is about 1:2.0.

The dimensions of each of the small silicon structures 108 (e.g., the depth D and the width $W_1$) may be such that a lateral cross-section of each of the small silicon structures 108 has a substantially square shape (e.g., about 52 nm by about 52 nm, about 32 nm by about 32 nm, etc.). In addition, the dimensions of each of the large silicon structures 110 (e.g., the depth D and the width $W_2$) may be such that a lateral cross-section of each of the large silicon structures 110 has a substantially rectangular shape (e.g., about 52 nm by about 130 nm, about 32 nm by about 80 nm, etc.). In additional embodiments, the lateral cross-section of at least one of the small silicon structures 108 and the large silicon structures 110 may be of a different shape including, but not limited to, a different tetragonal shape, (e.g., square, rectangular, trapezium, trapezoidal, parallelogram, etc.), a triangular shape, a circular shape, a semicircular shape, an ovular shape, or an elliptical shape.

In at least some embodiments, each of the small silicon structures 108 has a lateral cross-sectional area (e.g., the depth D by the width $W_1$) of less than or equal to about 3600 $nm^2$, such as less than or equal to about 2704 $nm^2$, or less than or equal to about 1024 $nm^2$. In additional embodiments, each of the large silicon structures 110 has a lateral cross cross-sectional area (e.g., the depth D by the width $W_2$) of less than or equal to about 9000 $nm^2$, such as less than or equal to about 6760 $nm^2$, or less than or equal to about 2560 $nm^2$.

Each of the silicon structures 112 and the silicon base 102 may be doped or undoped. As a non-limiting example, the silicon base 102 and a first portion (not numbered) of each of the silicon structures 112 proximate the silicon base 102 may include an n-type dopant, and a second portion (not numbered) of each of the silicon structures 112 proximate the top surface 114 of each of the silicon structures 112 may include a different dopant (e.g., the second portion of each of the small silicon structures 108 may include a p-type dopant, and the second portion of each of the large silicon structures 110 may include an n+ type dopant). As another non-limiting example, the silicon base 102 and the first portion of each of the silicon structures 112 may include a p-type dopant, and the second portion of each of the silicon structures 112 may include a different dopant (e.g., the second portion of each of the small silicon structures 108 may include an n-type dopant, and the second portion of each of the large silicon structures 110 may include a p+ type dopant).

Referring to FIG. 1B, which shows a partial cross-sectional view of the array of silicon structures 100 of FIG. 1A in a direction parallel to the rows (i.e., in the X direction shown in FIG. 1A), the dielectric material 120 may be formed in the isolation trenches 121. A top surface 122 of the dielectric material 120 within each of the first isolation trenches 118 and the second isolation trenches 119 (i.e., collectively the isolation trenches 121) may be substantially non-coplanar with the top surface 114 of each of the silicon structures 112 adjacent the dielectric material 120. Thus, the dielectric material 120 within each of the first isolation trenches 118 and the second isolation trenches 119 may protrude longitudinally beyond a plane 123, shown as a dashed line, defined by the top surface 114 of each of the silicon structures 112. A height differential between the top surface 122 of the dielectric material 120 and the plane 123 may depend upon the process used to form the isolation trenches 121. By way of non-limiting example, in at least some embodiments, a nitride material (not shown) may be used as a hard mask for an etching process to form the isolation trenches 121. Following the etching process, the nitride material may remain over the silicon structures 112, and the isolation trenches 121 may be filled with the dielectric material 120. The nitride material overlying the silicon structures 112 may then be removed to form the height differential between the top surface 122 of the dielectric material 120 and the plane 123. In additional embodiments, the top surface 122 of the dielectric material 120 may be substantially coplanar with the top surface 114 of each of the silicon structures 112 adjacent the dielectric material 120 (e.g., the dielectric material 120 may longitudinally extend to and substantially terminate at the plane 123). The dielectric material 120 may be any known dielectric material that substantially isolates each of the silicon structures 112 and that does not substantially react with metal (e.g., cobalt, nickel, titanium) of a metal material to form a metal silicide. By way of non-limiting example, the dielectric material 120 may be formed of and include a field oxide material, such as silicon dioxide ($SiO_2$), or a nitride material, such as silicon nitride ($Si_3N_4$).

The screen material 124 on the top surface 114 of each of the silicon structures 112 may be of any suitable thickness. In at least some embodiments, the screen material 124 has a thickness of about 3 nm. The screen material 124 may be any material that substantially controls implantation or diffusion of one or more materials (e.g., dopants) into each of the silicon structures 112. The screen material 124 may also prevent, by substantially limiting, damage to the silicon structures 112 during implantation. In at least some embodiments, the screen material 124 may be a screen oxide material, such as a middle temperature oxide (e.g., silicon oxide).

The array of silicon structures 100 may be formed using conventional techniques and conventional processing equipment (not shown), which are not described in detail herein.

Figure 1C:
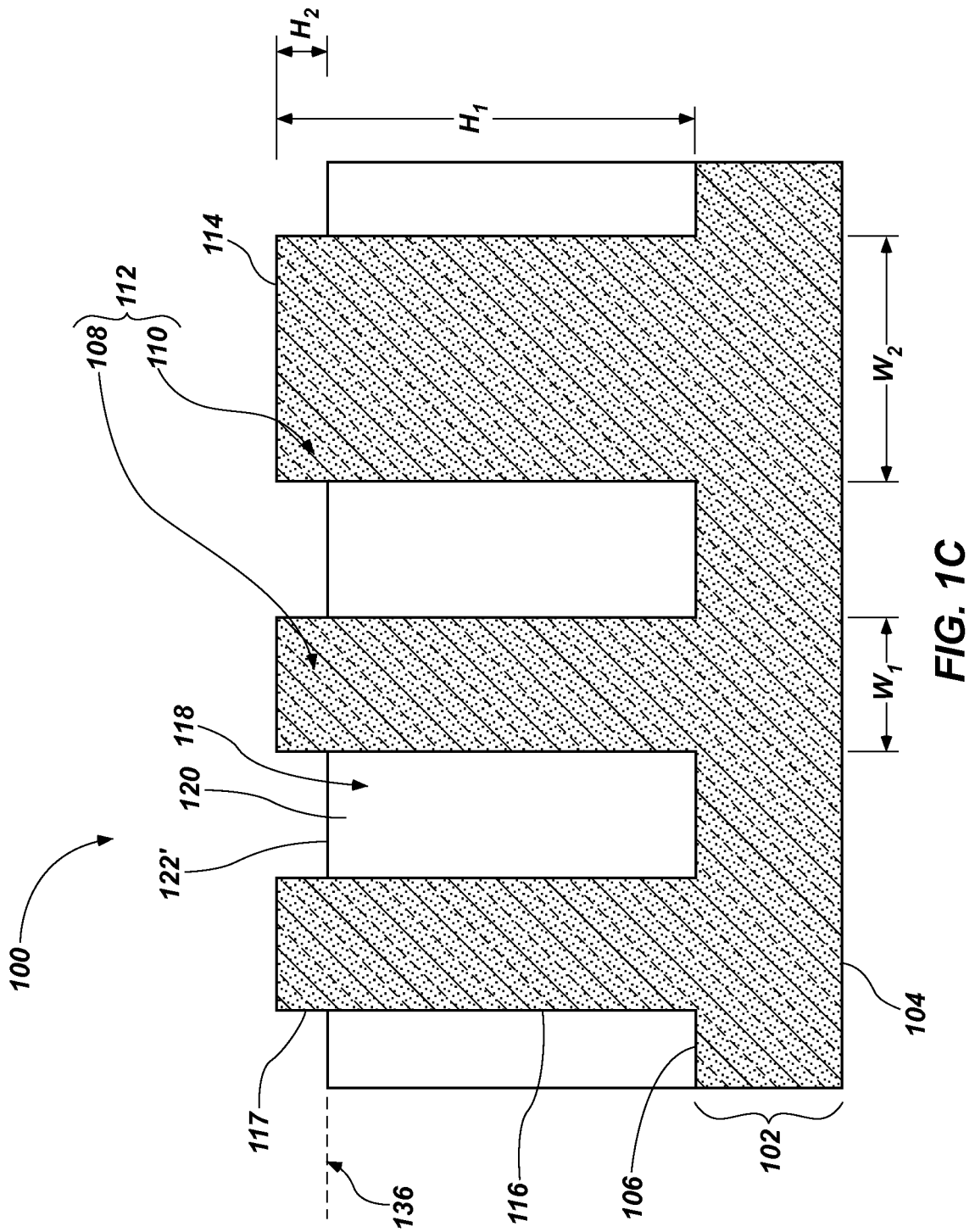

Referring in FIG. 1C, the array of silicon structures 100 may undergo a cleaning process to selectively remove the screen material 124 and a predetermined amount of the dielectric material 120 surrounding the sidewalls 116 of each of the silicon structures 112. The selective removal of the dielectric material 120 may recess the top surface 122' of the dielectric material 120 to expose a portion 117 of the sidewalls 116 of each of the silicon structures 112. The exposed portion 117 of the sidewalls 116 may extend a height $H_2$ beyond a lateral plane 136, shown by a dashed line, defined by the recessed top surface 122' of the dielectric material 120. The cleaning process may be tailored to achieve a desired magnitude of the height $H_2$ (i.e., to achieve a predetermined height differential between the top surface 114 of each of the silicon structures 112 and the recessed top surface 122' of the dielectric material 120). The magnitude of the height $H_2$ may be used to at least partially define the size of a subsequently formed metal silicide region on the silicon structure 112, as described in further detail below. In at least some embodiments, the magnitude of the height $H_2$ is within a range of from about 20 nm to about 25 nm. The cleaning process may utilize at least one material capable of removing the screen material 124 and the predetermined amount of the dielectric material 120 without removing a substantial portion of the silicon structures 112. By way of non-limiting example, the array of silicon structures 100 may be exposed to at least one of an aqueous solution of hydrogen fluoride (HF), and an aqueous solution of ammonium hydroxide (NH$_4$OH) and hydrogen peroxide (H$_2$O$_2$) for a sufficient amount of time to substantially remove the screen material 124 and the predetermined amount of the dielectric material 120 without removing a substantial portion of the silicon structures 112. In at least some embodiments, the array of silicon structures 100 is exposed to a 0.3% aqueous HF solution. The cleaning process may utilize a single step or multiple steps to remove the screen material 124 and the predetermined amount of the dielectric material 120.

Figure 1D:
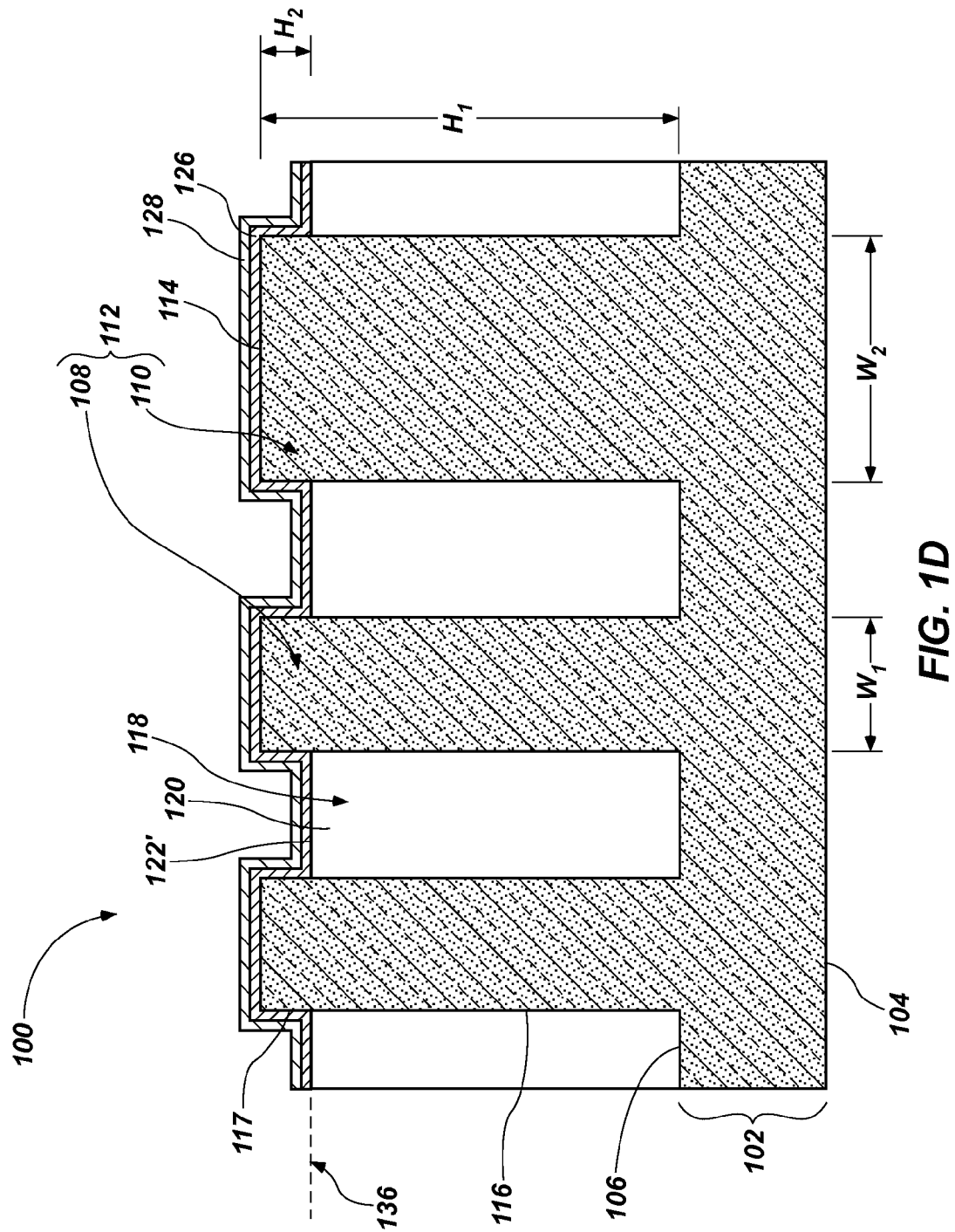

Referring to FIG. 1D, a metal material 126 may be formed over and in contact with exposed surfaces (e.g., the top surface 114 of each of the silicon structures 112, the exposed portion 117 of the sidewalls 116 of each of the silicon structures 112, and the recessed top surface 122' of the dielectric material 120) of the array of silicon structures 100. The metal material 126 may be formed substantially continuously across the exposed surfaces of the array of silicon structures 100. The metal material 126 may be substantially conformally deposited over the exposed surfaces of the array of silicon structures 100. The metal material 126 may be any metal or metal alloy as previously described and configured to react with the silicon structures 112 to form a metal silicide within the lateral cross-sectional area (e.g., the width W$_1$ or width W$_2$ by the depth D (FIG. 1A)) of each of the silicon structures 112. To ultimately form small metal silicide regions, the metal material 126 may be selected to have a relatively small grain size. In one embodiment, the metal material is Co. In another embodiment, the metal material is Ni. As a non-limiting example, if at least a portion of the silicon structures 112 (e.g., the small silicon structures 108) has a lateral cross-sectional area of less than or equal to about 3600 nm$^2$, such as less than or equal to about 2704 nm$^2$, or less than or equal to about 1024 nm$^2$, the metal material 126 may be one of cobalt (Co) and a Co-based alloy. As used herein, the term "Co-based alloy" means and includes a metal alloy including greater than or equal to about 80 atomic percent Co, and less than or equal to about 20 atomic percent of another metal capable of forming a metal silicide. The another metal may, for example, be a Group VIIIB metal of the Periodic Table of the Elements, such as nickel (Ni), palladium (Pd), and platinum (Pt); a Group IVB metal of the Periodic Table of the Elements, such as titanium (Ti), zirconium (Zr), and hafnium (Hf); a Group VB metal, such as vanadium (V), niobium (Nb), and tantalum (Ta); a Group VIB metal of the Periodic Table of the Elements, such as molybdenum (Mo), and tungsten (W); or a combination thereof. As another non-limiting example, if at least portion of the silicon structures 112 has a lateral cross-sectional area of less than or equal to about 3600 nm$^2$, such as less than or equal to about 2704 nm$^2$, or less than or equal to about 1024 nm$^2$, the metal material 126 may be one of Ni and a Ni-based alloy. As used herein, the term "Ni-based alloy" means and includes a metal alloy including greater than or equal to about 80 atomic percent Ni, and less than or equal to about 20 atomic percent of another metal capable of forming a metal silicide. The another metal may be substantially similar to the another metal described above with respect to the Co-based alloy. In at least some embodiments, the metal material 126 is Co. In additional embodiments, such as where the lateral cross-sectional area of each of the silicon structures 112 is larger than about 3600 nm$^2$, the metal material 126 may be one of Co, a Co-based alloy, Ni, and a Ni-based alloy, or the metal material 126 may be a different metal or a different metal alloy, such as at least one of Pd, Pt, Ti, Zr, Hf, V, Nb, Ta, Mo, W, alloys thereof, and combinations thereof.

The metal material 126 may be formed of any thickness suitable to facilitate subsequent formation of metal silicide regions having desired sizes and desired geometric configurations, as described in further detail below. As shown in FIG. 1D, a thickness of the metal material 126 may vary across the exposed surfaces of the array of silicon structures 100. The metal material 126 may have a first thickness along the top surface 114 of each of the silicon structures 112 and along the recessed top surface 122' of the dielectric material 120, and a second thickness along the exposed portion 117 of the sidewalls 116 of each of the silicon structures 112. The first thickness of the metal material 126 may be greater than the second thickness of the metal material 126. As a non-limiting example, a ratio of the first thickness of the metal material 126 to the second thickness of the metal material 126 may be within a range of from about 1:0.8 to about 1:0.4 (i.e., the second thickness may be from about 80 percent to about 40 percent as thick as the first thickness), such as from about 1:0.7 to about 1:0.5 (i.e., the second thickness may be from about 70 percent to about 50 percent as thick as the first thickness), or from about 1:0.65 to about 1:0.55 (i.e., the second thickness may be from about 65 percent to about 55 percent as thick as the first thickness). In at least some embodiments, the ratio of the first thickness of the metal material 126 to the second thickness of the metal material 126 is about 1:0.6 (i.e., a magnitude of the second thickness is equal to about 60 percent of a magnitude of the first thickness). The thickness of the metal material 126 across the exposed surfaces of the array of silicon structures 100 may at least partially depend upon the magnitude of the height H$_2$ and the technique used to form the metal material 126. A ratio of the height H$_2$ to the first thickness of the metal material 126 may be within a range of from about 1:0.15 to about 1:0.25, such as from about 1:0.18 to about 1:0.22, or from about 1:0.19 to about 1:0.21. In at least some embodiments, the ratio of the height H$_2$ to the first thickness of the metal material 126 is about 1:0.2 (i.e., a magnitude of the first thickness is equal to about 20 percent of a magnitude of the height H$_2$). The ratio of the first thickness of the metal material 126 to the second thickness of the metal material 126 may correspond to the ratios previously described above. As a non-limiting example, if the height H$_2$ is within a range of from about 20 nm to about 25 nm, the first thickness of the metal material 126 may be within a range of from about 4 nm to about 5 nm and the second thickness of the metal material 126 may be within a range of from about 2.4 nm to about 3 nm. In additional embodiments, the thickness of the metal material 126 may be substantially uniform across the exposed surfaces of the array of silicon structures 100.

The metal material 126 may be formed over and in contact with exposed surfaces of the array of silicon structures 100 using conventional techniques and conventional processing equipment. By way of non-limiting example, the metal material 126 may be deposited using a physical vapor deposition ("PVD") technique, a chemical vapor deposition ("CVD") technique, or an atomic layer deposition ("ALD") technique. PVD includes, but is not limited to, sputtering, evaporation, or ionized PVD. Such techniques are known in the art and, therefore, are not described in detail herein. In at least some embodiments, the metal material 126 is deposited over and in contact with the exposed surfaces of the array of silicon structures 100 using a PVD technique.

With continued reference to FIG. 1D, a capping material 128 may be formed over and in contact with exposed surfaces of the metal material 126. The capping material 128 may be formed substantially continuously across the exposed surfaces of the metal material 126. In addition, the capping material 128 may substantially conform to the exposed surfaces of the metal material 126. The capping material 128 may be any material capable of substantially limiting or preventing each of the oxidization of the metal material 126 and the overgrowth of metal silicide material during subsequent processing. By way of non-limiting example, the capping material 128 may be at least one of titanium nitride (TiN), titanium tungsten, tantalum nitride, tungsten nitride, and elemental Ti. In at least some embodiments, the capping material 128 is TiN.

The capping material 128 may be of any thickness that facilitates subsequent formation of metal silicide regions having desired sizes and geometric configurations, as described in further detail below. The thickness of the capping material 128 may be substantially uniform, or may vary across the exposed surfaces of the metal material 126. In at least some embodiments, the thickness of the capping material is substantially uniform. In addition, the thickness of the capping material 128 may be greater than or equal to the thickness of the metal material 126. As a non-limiting example, the thickness of the capping material 128 may be within a range of from about 5 nm to about 15 nm, such as from about 7 nm to about 13 nm, or from about 9 nm to about 11 nm. In at least some embodiments, the thickness of the capping material 128 across the exposed surfaces of the metal material 126 is about 10 nm. The capping material 128 may be formed over and in contact with the exposed surfaces of the metal material 126 using conventional techniques, such as a PVD technique, a CVD technique, or an ALD technique, which are not described in detail herein.

Figure 1E:
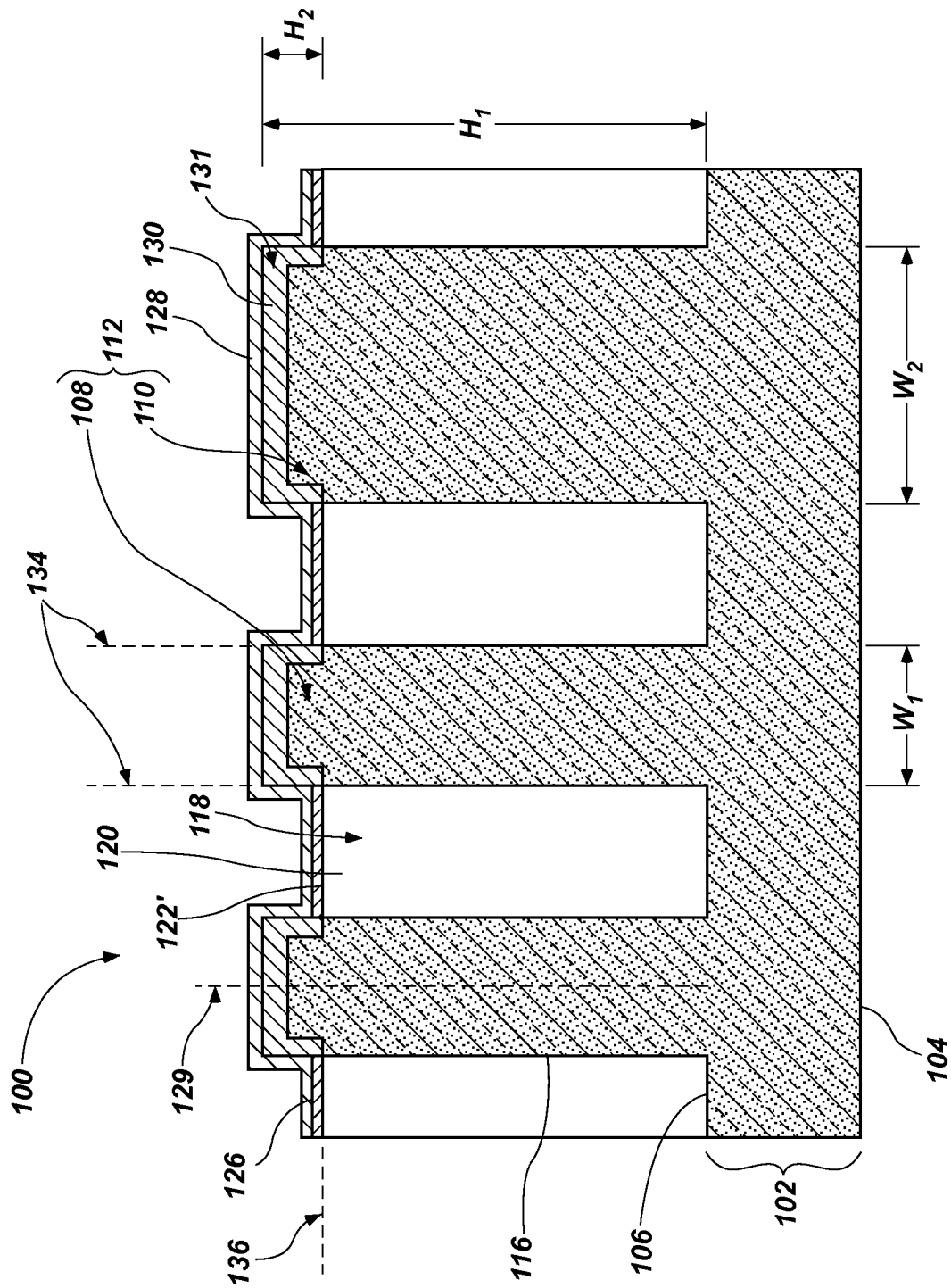

Referring next to FIG. 1E, the array of silicon structures 100 may be subjected to a first thermal treatment to form first metal silicide regions 131 including a first metal silicide material 130. As a non-limiting example, the array of silicon structures 100 may be subjected to rapid thermal processing (RTP) in an inert atmosphere (e.g., an $N_2$ atmosphere) at a temperature within a range of from about 400° C. to about 600° C., such as from about 480° C. to about 560° C., for a period of time within a range of from about 10 seconds to about 120 seconds, such as from about 20 seconds to about 60 seconds. In at least some embodiments, the array of silicon structures 100 is heated in an $N_2$ atmosphere at a temperature of about 530° C. for about 30 seconds. The first thermal treatment enables at least a portion of the metal material 126 over and in contact with the top surface 114 (FIG. 1D) and the exposed portion 117 (FIG. 1D) of the sidewalls 116 of each of the silicon structures 112 to diffuse into each of the silicon structures 112 and effectuate a silicidation reaction to form the first metal silicide material 130. By way of non-limiting example, if the metal material 126 includes Co, the Co may diffuse laterally (e.g., from the exposed portion 117 of the sidewalls 116) and longitudinally (e.g., from the top surface 114) into each of the silicon structures 112 and react with the Si therein to form cobalt monosilicide (CoSi). The metal material 126 over and in contact with the recessed top surface 122' of the dielectric material 120 does not substantially diffuse into the dielectric material 120, and may substantially remain over and in contact with recessed top surface 122'.

As shown in FIG. 1E, the diffusion of the metal material 126 through the top surface 114 (FIG. 1D) and through the exposed portion 117 (FIG. 1D) of the sidewalls 116 of each of the silicon structures 112 enables each of the first metal silicide regions 131 to have an inverted substantially "u-shaped" geometric configuration, wherein the first metal silicide material 130 laterally surrounds and longitudinally surrounds at least a portion of a corresponding silicon structure 112 (e.g., a portion of a corresponding silicon structure 112 above the recessed top surface 122' of the dielectric material 120). The multidirectional diffusion (e.g., longitudinal diffusion and lateral diffusion) of the metal material 126 into each of the silicon structures 112 improves the peripheral compositional uniformity and the peripheral thickness uniformity of the first metal silicide region 131 as compared to conventional silicidation processes that utilize unidirectional diffusion (e.g., in a primarily longitudinal direction) of a metal material to form metal silicide regions. In addition, the multidirectional diffusion of the metal material 126 of the present disclosure facilitates improved control of the size of each of the first metal silicide regions 131. The geometry of the metal material 126 on the exposed sidewalls 117 of each of the silicon structures 112, in conjunction with the geometry of the capping material 128 on the metal material 126, facilitates lateral diffusion of the metal material 126 toward a longitudinal centerline 129, shown as a dashed line, of each of the silicon structures 112 and also substantially impedes or prevents lateral diffusion of the metal material 126 beyond longitudinal planes 134, shown by dashed lines, defined by the sidewalls 116 of the silicon structures 112. Accordingly, the first metal silicide material 130, and, hence, each of the first metal silicide regions 131, may be substantially confined within a lateral cross-sectional area defined by the sidewalls 116 of the corresponding silicon structure 112 (e.g., an area of about 3600 $nm^2$ if a corresponding silicon structure 112 is about 60 nm in depth by about 60 nm in width; an area of about 2704 $nm^2$ if a corresponding silicon structure 112 is about 52 nm in depth by about 52 nm in width; an area of about 1024 $nm^2$ if a corresponding silicon structure 112 is about 32 nm in depth by about 32 nm in width; etc.). Furthermore, at least the magnitude of the height $H_2$ and the relatively reduced thickness (i.e., the second thickness described above in relation to FIG. 1C) of the metal material 126 on the exposed portion 117 of the sidewalls 116 of each of the silicon structures 112 may substantially limit the longitudinal diffusion of the metal material 126 beyond the lateral plane 136, shown as a dashed line, defined by the recessed top surface 122' of the dielectric material 120.

Accordingly, a method of forming a metal silicide region may include forming an array of silicon structures including silicon structures separated by a dielectric material, and a screen material over and in contact with a top surface of each of the silicon structures. The dielectric material may substantially cover sidewalls of each of the silicon structures. The screen material and a portion of the dielectric material may be removed to expose the top surface and a portion of the sidewalls of each of the silicon structures. A metal material may be formed over and in contact with the top surface and the exposed portion of the sidewalls of each of the silicon structures. A capping material may be formed over and in contact with the metal material. The array of silicon structures may be heated to form a metal silicide region in each of the silicon structures.

Figure 1F:
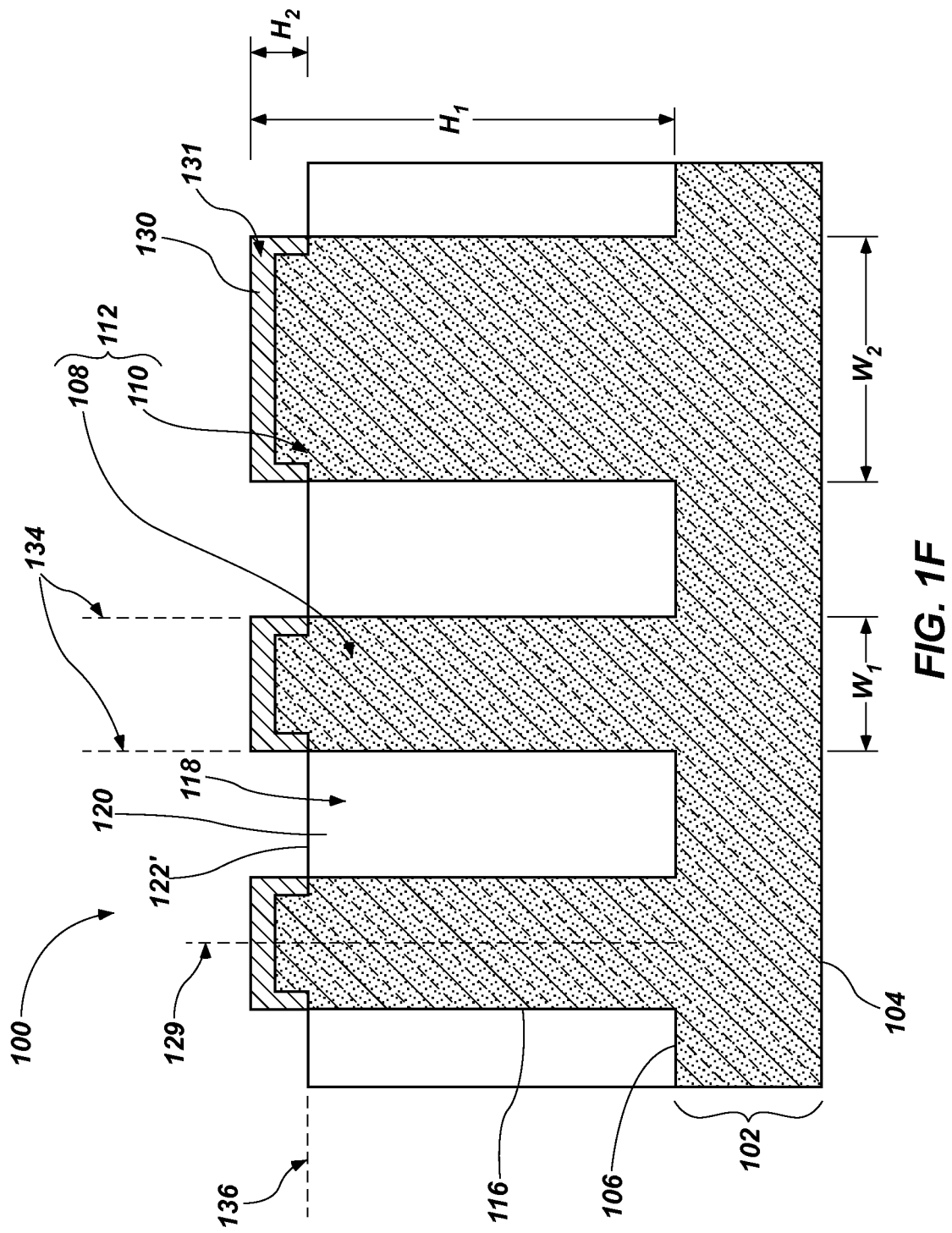

Referring next to FIG. 1F, each of the capping material 128 and unreacted portions of the metal material 126 (e.g., portions of the metal material 126 over and in contact with the recessed top surface 122' of the dielectric material 120, and any metal material 126 remaining following the silicidation reaction with the silicon structures 112) may be selectively removed. By way of non-limiting example, the array of silicon structures 100 may be subjected to an isotropic etch, such as a wet etch, that substantially removes the capping material 128 and the unreacted portions of the metal material 126 but that does not substantially remove the first metal silicide material 130. The wet etch may, for example, be effectuated by exposing the array of silicon structures 100 to a conventional wet etchant, such as at least one of a mixture of sulfuric acid ($H_2SO_4$) and $H_2O_2$, a mixture of $NH_4OH$ and $H_2O_2$, and a mixture of phosphoric acid ($H_3PO_4$), acetic acid (AcOH), nitric acid ($HNO_3$), and $H_2O_2$.

Figure 1G:
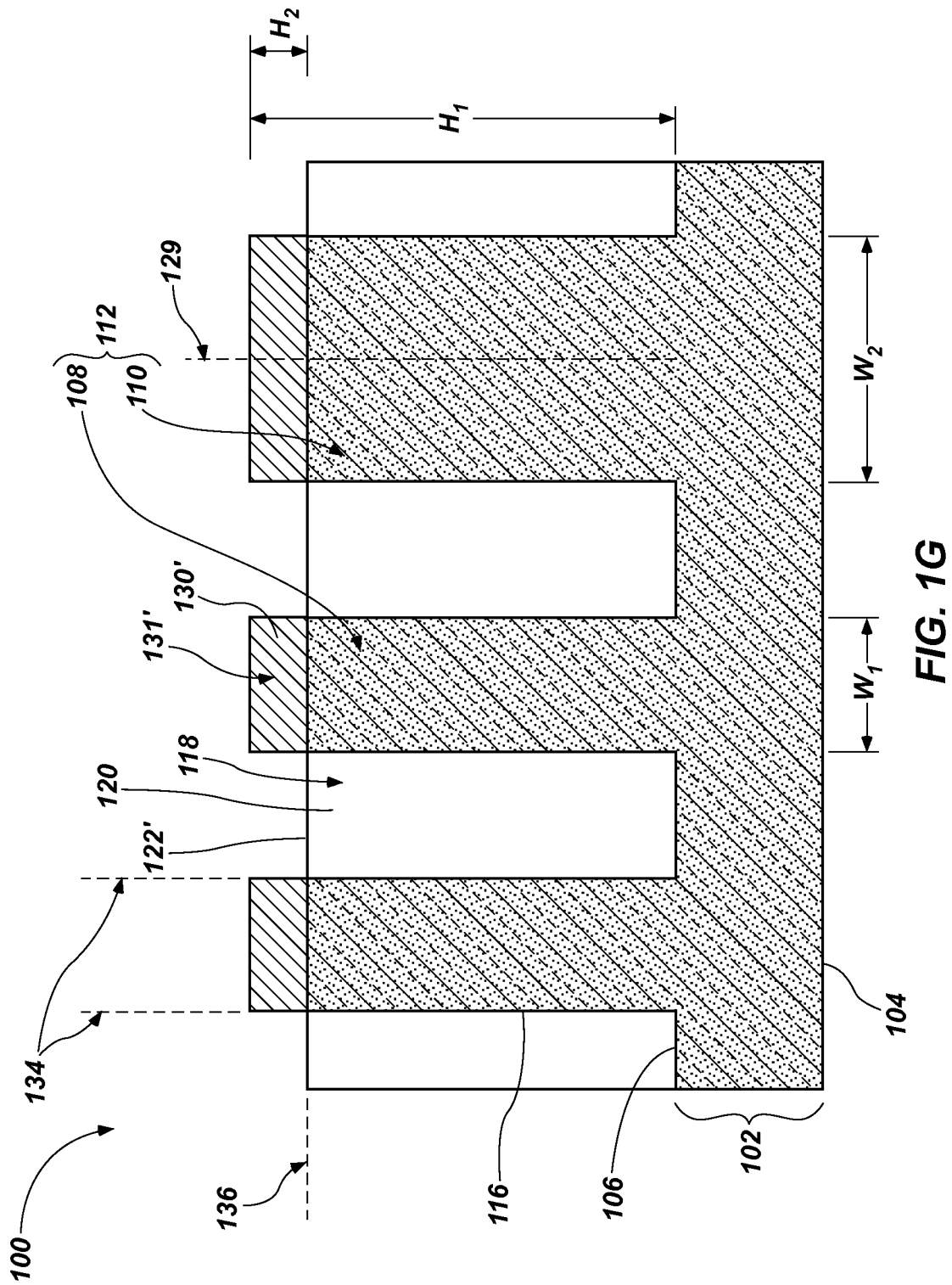

Referring to FIG. 1G, the array of silicon structures 100 may be subjected to a second thermal treatment to form second metal silicide regions 131' including a second metal silicide material 130'. The second thermal treatment may extend, in a longitudinal direction, at least a portion of each the first metal silicide regions 131 (FIG. 1F) and may substantially convert the first metal silicide material 130 (FIG. 1F) into the second metal silicide material 130'. Thus, the silicon of the silicon structures 112 may be substantially completely silicidated to a height $H_2$. By way of non-limiting example, the array of silicon structures 100 may be subjected to additional RTP in an inert atmosphere at a temperature within a range of from about 700° C. to about 900° C., such as from about 750° C. to about 850° C., for a period of time within a range of from about 10 seconds to about 120 seconds, such as from about 20 seconds to about 60 seconds. In at least some embodiments, the array of silicon structures 100 is heated in an $N_2$ atmosphere at a temperature of about 830° C. for about 20 seconds. The second metal silicide material 130' may have a lower electrical resistance than that of the first metal silicide material 130. By way of non-limiting example, if the first metal silicide material 130 is CoSi, the second thermal treatment may substantially convert the CoSi into cobalt disilicide ($CoSi_2$), which has a lower electrical resistance than CoSi. In addition, as shown in FIG. 1G, the second thermal treatment may extend at least a portion (e.g., a central portion) of each of the first metal silicide regions 131 (e.g., by longitudinal diffusion of metal material) such that a bottom surface of each of the second metal silicide regions 131' is substantially coplanar with the recessed top surface 122' of the dielectric material 120. In additional embodiments, the bottom portion of at least one of the second metal silicide regions 131' may be substantially non-coplanar with recessed top surface 122' of the dielectric material 120 (e.g., at least a portion of the bottom portions of the second metal silicide regions 131' may longitudinally extend beyond the lateral plane 136 defined by the recessed top surface 122' of the dielectric material 120). In addition, the second metal silicide material 130', and, hence, each of the second metal silicide regions 131', may be substantially confined within the lateral cross-sectional area defined by the sidewalls 116 of corresponding silicon structures 112. As illustrated in FIG. 1G, the second metal silicide regions 131' may have a substantially rectangular shape. In additional embodiments, at least one of the second metal silicide regions 131' may have a different shape (e.g., a different tetragonal shape, a triangular shape, a semicircular shape, etc.), at least partially depending on a geometric configuration of each of the silicon structures 112. The second metal silicide regions 131' may exhibit good compositional uniformity and good thickness uniformity at the longitudinal centerline 129 of each of the silicon structures 112, as well as along the longitudinal planes 134 defined by the sidewalls 116 of each of the silicon structures 112.

While various embodiments and examples herein describe forming second metal silicide regions 131' of $CoSi_2$, other metal silicides may be formed by appropriately selecting the metal material from one of the metal materials previously described.

Accordingly, a method of forming a metal silicide region may include forming a metal material over and in contact with exposed surfaces of a dielectric material and silicon structures protruding from the dielectric material. A capping material may be formed over and in contact with the metal material. The silicon structures may be exposed to heat to effectuate a multidirectional diffusion of the metal material into the silicon structures to form a first metal silicide material. The capping material and unreacted portions of the metal material may be removed. The silicon structures may be exposed to heat to substantially convert the first metal silicide material into a second metal silicide material.

Furthermore, an array of silicon structures of the present disclosure may include silicon pillars each having a metal silicide region confined within a lateral cross-sectional area defined by sidewalls of each of the silicon pillars, the lateral cross-sectional area being less than or equal to about 3600 $nm^2$, such as less than or equal to about 2704 $nm^2$, or less than or equal to about 1024 $nm^2$.

In addition, an array of silicon structures of the present disclosure may include silicon pillars each having a metal silicide region, the metal silicide region of at least one of the silicon pillars being confined within a lateral cross-sectional area defined by sidewalls of the at least one of the silicon pillars and having a bottom surface substantially coplanar with a top surface of a dielectric material surrounding each of the silicon pillars.

Figure 2:
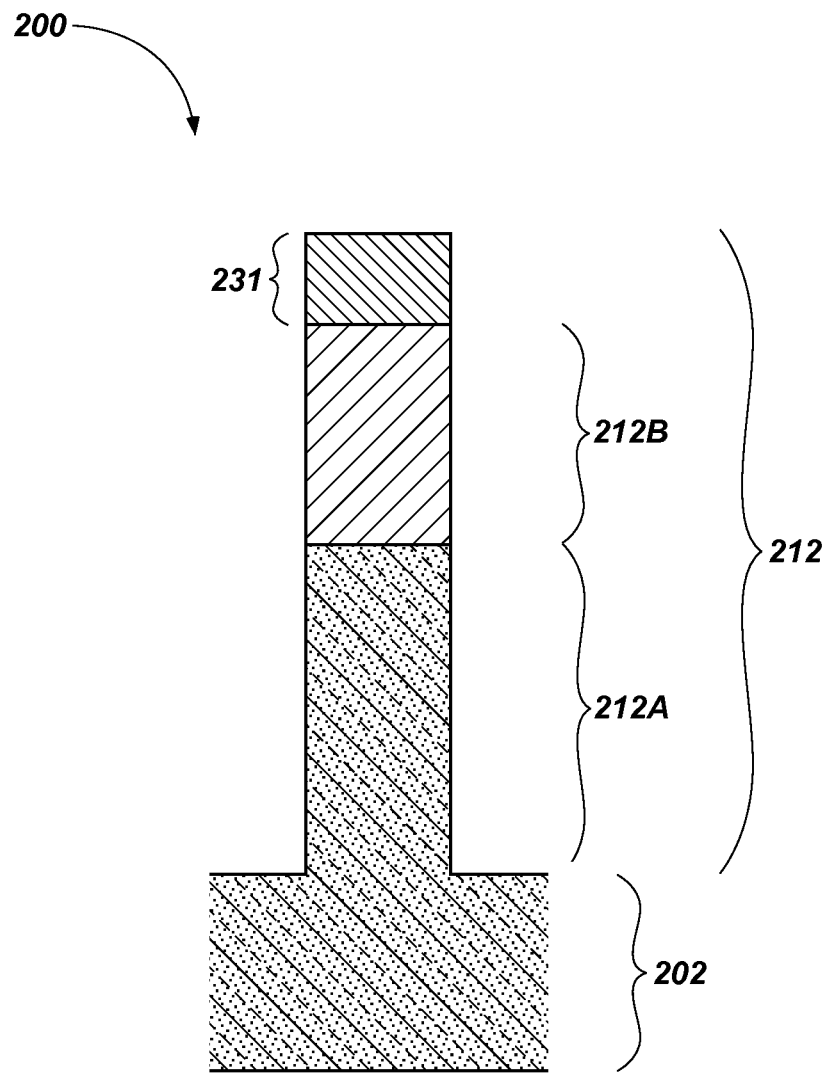
FIG. 2 illustrates a semiconductor device structure in accordance with an embodiment of the present disclosure.

FIG. 2 illustrates a semiconductor device structure 200 in accordance with an embodiment of the present disclosure. The semiconductor device structure 200 includes a silicon base 202, and a silicon structure 212 including a metal silicide region 231. The silicon base 202, and the silicon structure 212 including the metal silicide region 231 may, respectively, be substantially similar to the silicon base 102, and one of the silicon structures 112 (e.g., one of the small silicon structures 108, or one of the large silicon structures 110) including the second metal silicide region 131', described above in relation to the array of silicon structures 100. As depicted in FIG. 2, the silicon structure 212 may include a first region 212A longitudinally adjacent the silicon base 202, and a second region 212B between the first region 212A and the metal silicide region 231. The silicon base 202 and the first region 212A of the silicon structure 212 may each include a first dopant. The second region 212B of the silicon structure 212 may include a second dopant that is different than the first dopant. By way of non-limiting example, the first dopant may be an n-type dopant and the second dopant may be a p-type dopant. By way of additional non-limiting example, the first dopant may be an n-type dopant, and the second dopant may be an n+ type dopant. As yet a further non-limiting example, the first dopant may be a p-type dopant, and the second dopant may be an n-type dopant. As yet still a further non-limiting example, the first dopant may be a p-type dopant, and the second dopant may be a p+ type dopant. In at least some embodiments, the silicon base 202 and the first region 212A of the silicon structure each include an n-type dopant, the second region 212B of the silicon structure 212 includes a p-type dopant, and the metal silicide region 231 includes $CoSi_2$.

Accordingly, a semiconductor device structure of the present disclosure may include a silicon base including a first dopant, and a silicon structure having a lateral cross-sectional area of less than or equal to about 3600 $nm^2$. The silicon structure may include a first region longitudinally adjacent the silicon base and comprising the first dopant, a second region longitudinally adjacent the first region and comprising a second dopant, and a metal silicide region longitudinally adjacent the second region and confined within the lateral cross-sectional area of the silicon structure.

The methods of the present disclosure provide an effective and reliable way to control the size and shape of the metal silicide regions 131, 131'. The multidirectional diffusion of the metal material 126 into the silicon structures 112 enables greater control of the uniformity of the metal silicide regions 131, 131' than has previously been available in the industry, which enhanced uniformity, facilitates greater reliability in the finished semiconductor device. The multidirectional diffusion of the metal material 126 into the silicon structures 112 also avoids the diffusion of the metal material 126 beyond the area defined by the sidewalls 116 of each of the silicon structures 112, advantageously enabling the formation of smaller metal silicide regions 131, 131' than has previously been achievable. The methods of the present disclosure advantageously facilitate improved silicon performance, lower cost, increased miniaturization of components, and greater packaging density as compared to conventional methods of forming a metal silicide region for a silicon structure.

The following examples serve to explain embodiments of the present disclosure in more detail. The examples are not to be construed as being exhaustive or exclusive as to the scope of the disclosure.

EXAMPLES

Example 1

Figure 3A:
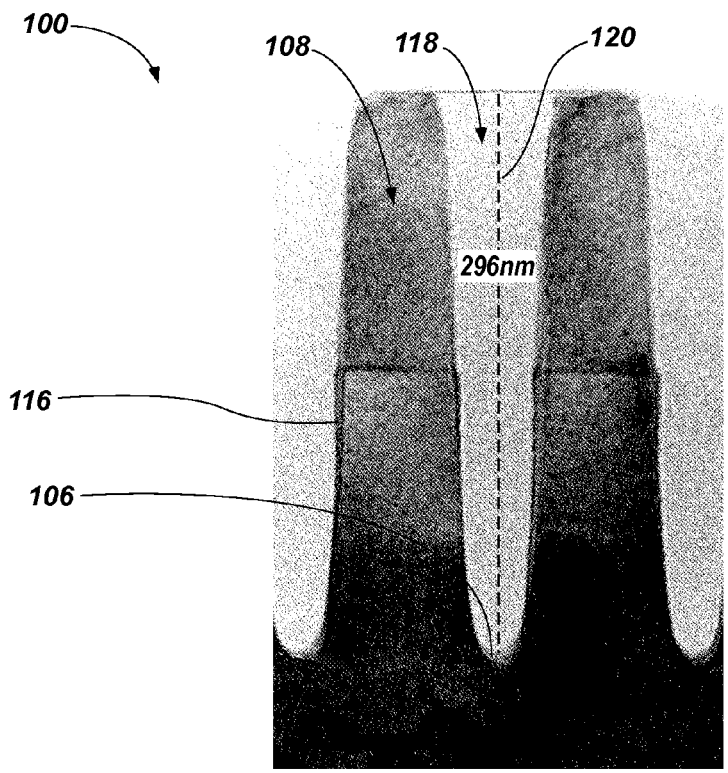
FIGS. 3A through 3D are transmission electron micrographs (TEMs) showing the formation of $CoSi_2$ regions for silicon pillars using an embodiment of the present disclosure, as described in Example 1.

Referring to FIGS. 3A through 3D, $CoSi_2$ regions were formed using an embodiment of the method of the present disclosure. FIG. 3A is a transmission electron micrograph (TEM) showing a partial cross-sectional view of an array of Si pillars (i.e., in a direction parallel to columns of the Si pillars) that were conventionally formed and surrounded by $SiO_2$. The Si pillars each had a height within a range of from about 294 nm to about 297 nm, a top surface width of about 52 nm, and a top surface depth of about 52 nm. The $SiO_2$ surrounding each of the Si pillars had a top surface that was substantially coplanar with a top surface of each of the Si pillars, such that the $SiO_2$ also had a height within a range of from about 294 nm to about 297 nm.

Figure 3B:
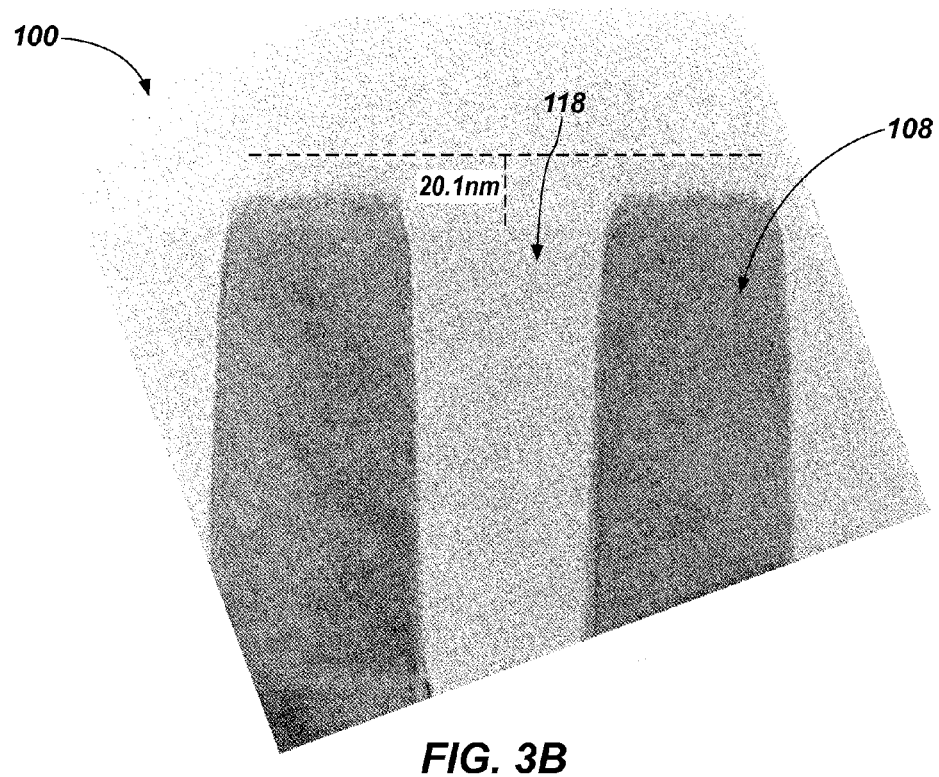

FIG. 3B is a TEM showing a portion of the Si pillars and the $SiO_2$ shown in FIG. 3A following treatment with a 0.3% aqueous HF solution. The array of Si pillars was introduced to an immersion wet bench including the 0.3% aqueous HF solution. As shown in FIG. 3B, the treatment selectively removed a portion of the $SiO_2$ surrounding each of the Si pillars to expose a portion of the sidewalls of each of the Si pillars. A height differential between the top surface of the $SiO_2$ and the top surface of each of the Si pillars was within a range of from about 20 nm to about 25 nm (a 20.1 nm height differential is depicted in FIG. 3B).

Figure 3C:
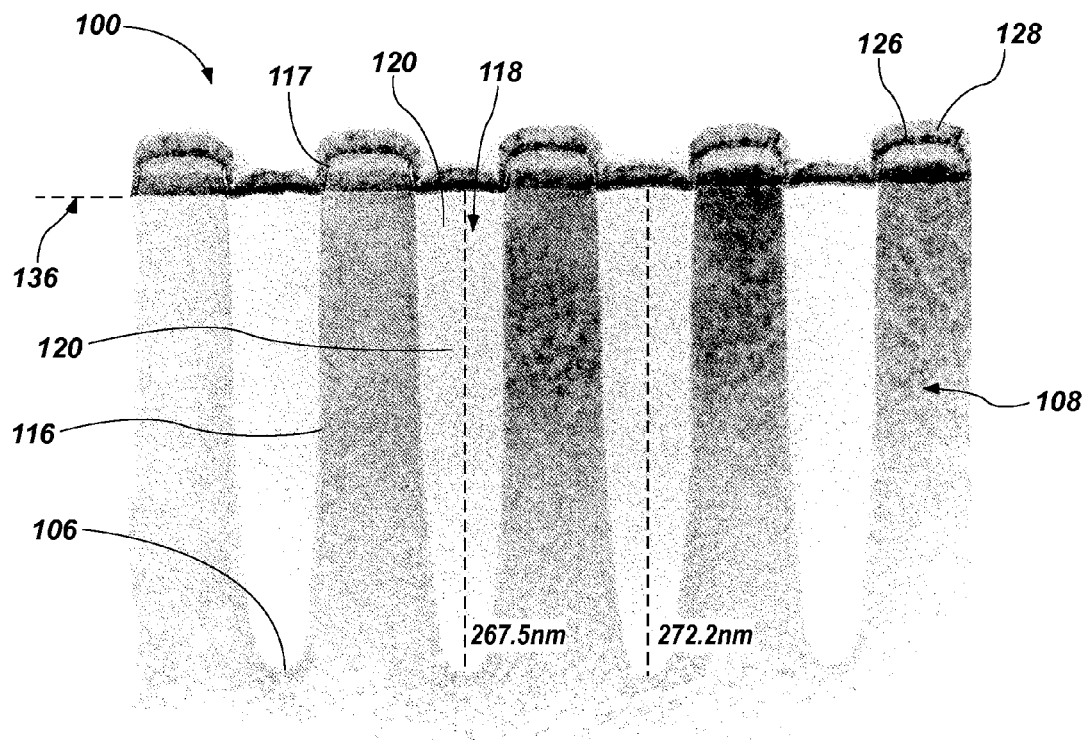

FIG. 3C is a TEM showing an expanded view of the Si pillars and the $SiO_2$ shown in FIG. 3A following a conformal deposition of Co on the top surface of each of the Si pillars and on the top surface of the $SiO_2$ and following a conformal deposition of TiN on the top surface of the Co. The Co had a thickness of about 5 nm on the top surface of each of the Si pillars and on the top surface of the $SiO_2$. The Co had a thickness within a range of from about 2 nm to about 3 nm on the exposed sidewalls of the Si pillars. The TiN had a thickness of about 4 nm.

Figure 3D:
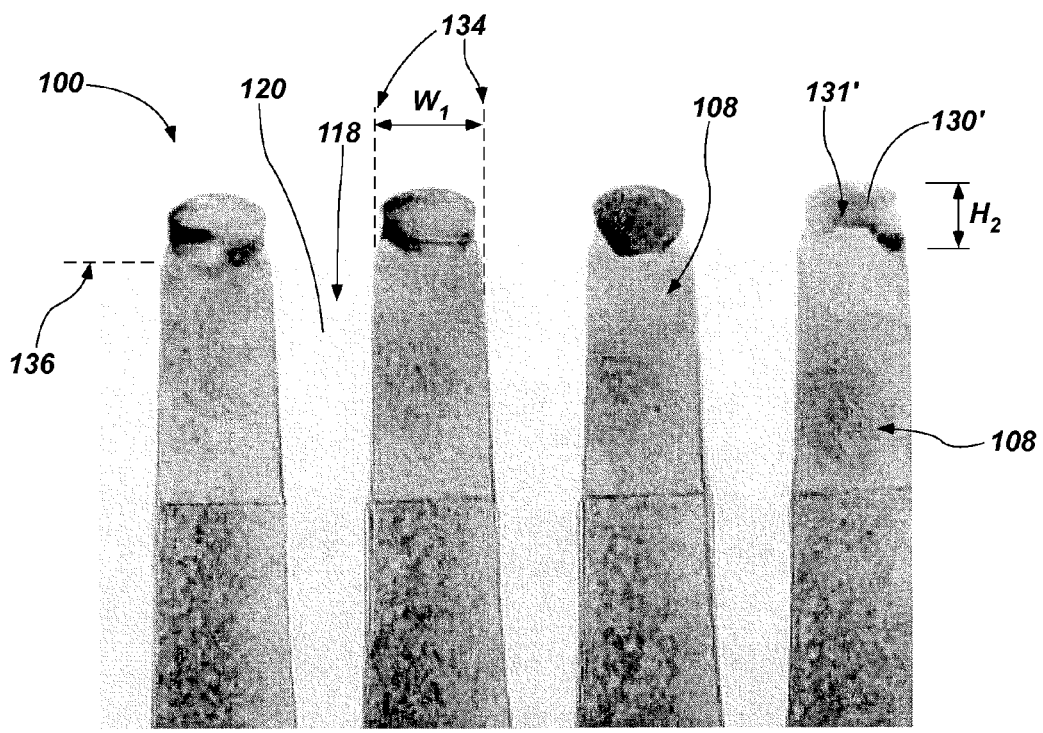

FIG. 3D is a TEM showing the $CoSi_2$ regions that were ultimately formed (i.e., following each of a first RTP at 480° C. for 30 seconds, a selective removal of the TiN and unreacted Co, and a second RTP at 830° C. for 20 seconds) using an embodiment of the method of the present disclosure. Each of the $CoSi_2$ regions had a width of less than or equal to about 52 nm and a depth of less than or equal to about 52 nm. As shown in FIG. 3D, each of the $CoSi_2$ regions was substantially confined within (i.e., did not substantially laterally extend beyond) a lateral cross-sectional area defined by the sidewalls of the Si pillars. In addition, each of the $CoSi_2$ regions did not substantially longitudinally extend below a plane defined by the top surface of the $SiO_2$ surrounding each of the Si pillars.

Example 2

Figure 4A:
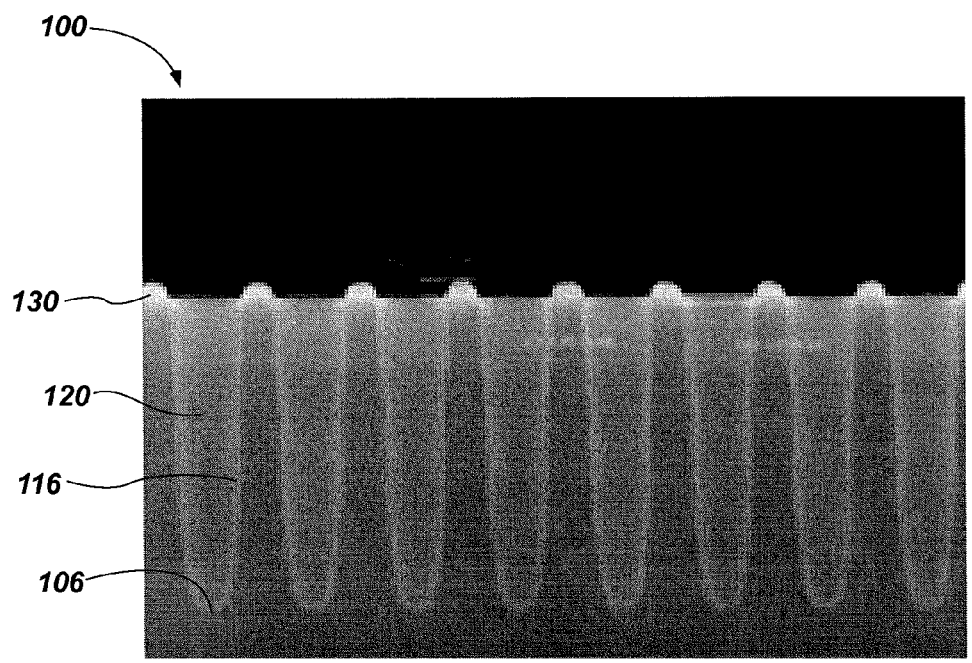
FIGS. 4A and 4B are scanning electron micrographs (SEMs) showing $CoSi_2$ regions of silicon pillars that were formed using an embodiment of the method of the present disclosure, as described in Example 2.

Referring to FIGS. 4A through 4F, additional $CoSi_2$ regions were formed by an embodiment of the method of the present disclosure. FIG. 4A is a scanning electron micrograph (SEM) showing a partial cross-sectional view of $CoSi_2$ regions that were formed on Si pillars (i.e., in a direction parallel to columns of the Si pillars) using an embodiment of the method of the present disclosure. Each of the Si pillars had a top surface width of about 32 nm and a top surface depth of about 32 nm. The $CoSi_2$ regions shown in FIG. 4A each had a width of less than or equal to about 32 nm and a depth of less than or equal to about 32 nm (i.e., each of the $CoSi_2$ regions was substantially confined within a lateral cross-sectional area defined by the sidewalls of the Si pillars). In addition, a major portion of each the $CoSi_2$ regions was located above a plane defined by the top surface of the $SiO_2$ surrounding each of the Si pillars. As shown in FIG. 4A, the $CoSi_2$ regions exhibited good composition uniformity at a longitudinal center of each of the Si pillars, as well as at the sidewalls of each of the Si pillars.

Figure 4B:
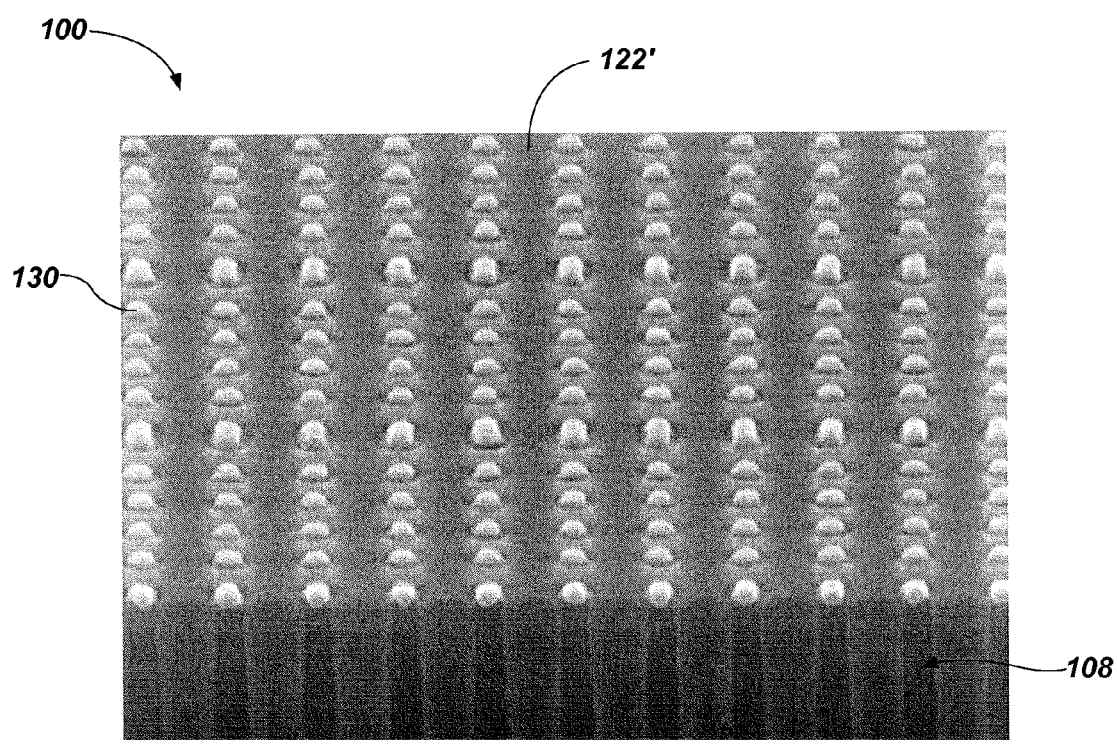
Figure 4C:
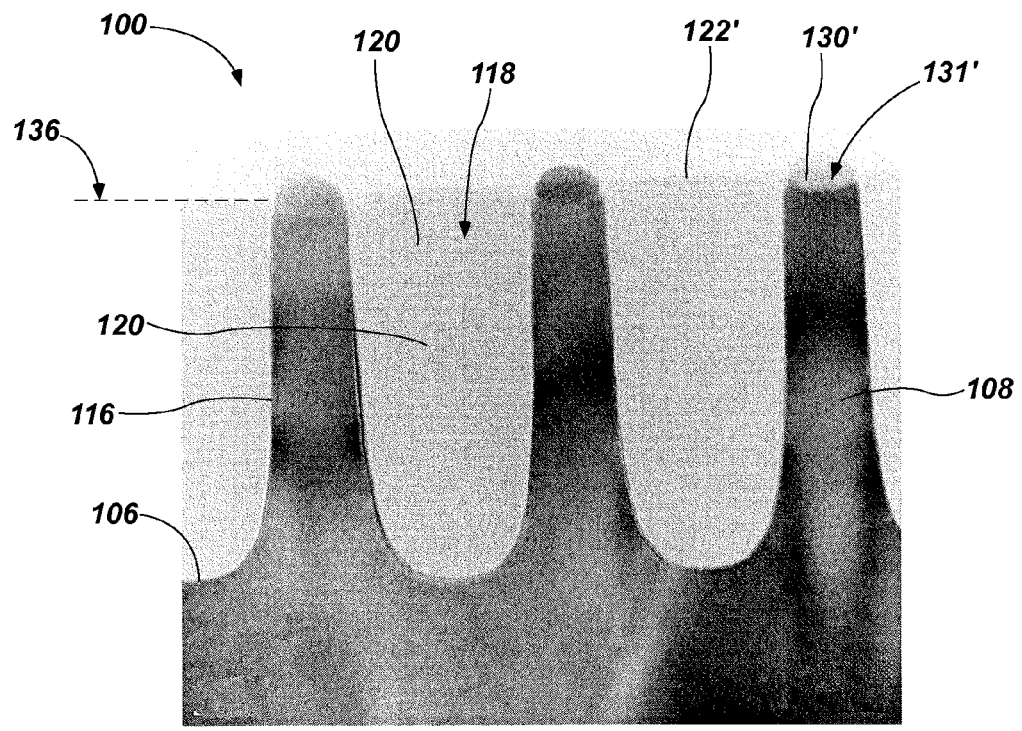
FIGS. 4C and 4D are TEMs showing $CoSi_2$ regions of silicon pillars that were formed using an embodiment of the method of the present disclosure, as described in Example 2.
Figure 4D:
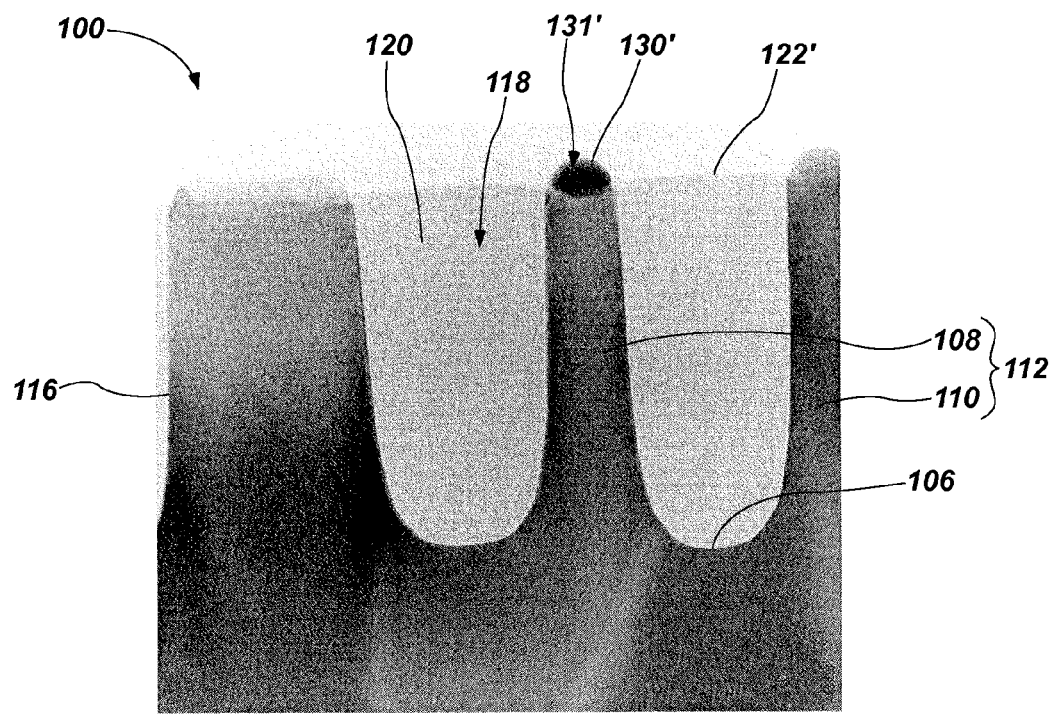

FIG. 4B is an SEM showing a perspective view of the $CoSi_2$ regions shown in FIG. 4A. FIG. 4B illustrates an array of Si pillars upon which the $CoSi_2$ regions were formed. In addition to the $CoSi_2$ regions shown in FIG. 4A, FIG. 4B shows relatively larger $CoSi_2$ regions that were foinied on large Si pillars or the array. Each of the large Si pillars had a top surface width of about 80 nm and a top surface depth of about 32 nm. The $CoSi_2$ regions formed on the large Si pillars each had a width of less than or equal to about 80 nm and a depth of less than or equal to about 32 nm (i.e., each of the $CoSi_2$ regions was substantially confined within a lateral cross-sectional area defined by the sidewalls of the large Si pillars). FIG. 4C is a TEM showing a partial cross-sectional view of the Si pillars and corresponding $CoSi_2$ regions shown in FIG. 4B (i.e., in a direction parallel to rows of the Si pillars). FIG. 4D is a TEM showing another partial cross-sectional view of the Si pillars and corresponding $CoSi_2$ regions shown in FIG. 4B (i.e., showing the large Si pillars and large $CoSi_2$ regions).

Figure 4E:
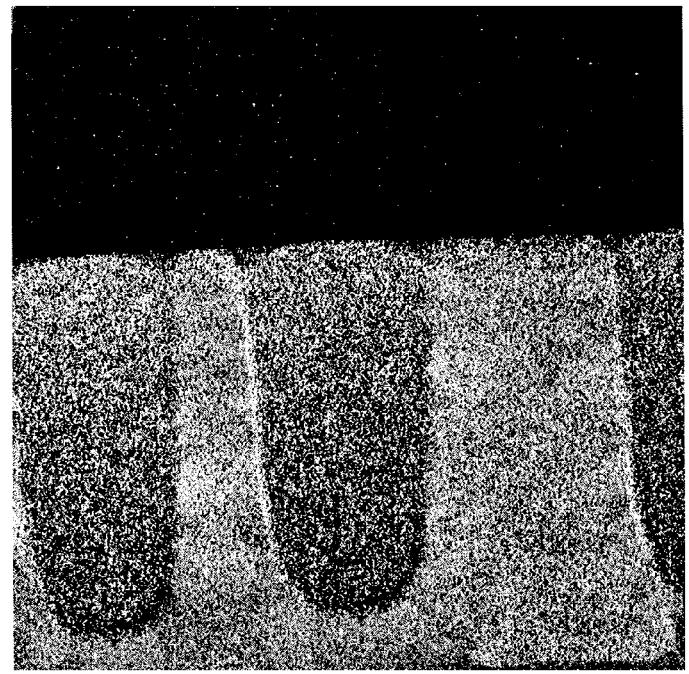
FIGS. 4E and 4F are, respectively, a silicon map and a cobalt map for silicon pillars including $CoSi_2$ regions that were formed using an embodiment of the method of the present disclosure, as described in Example 2.
Figure 4F:
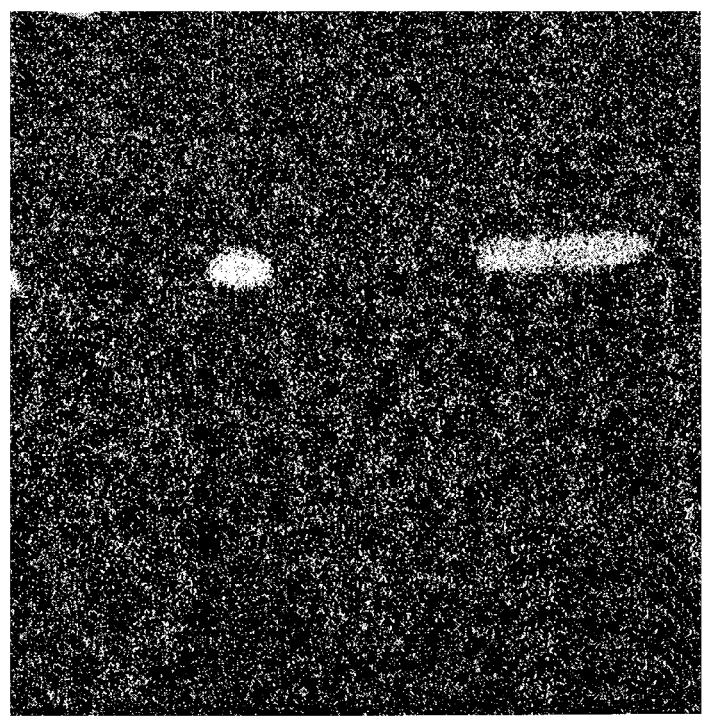

FIG. 4E is an Si map of the Si pillars and corresponding $CoSi_2$ regions shown in FIG. 4D. FIG. 4F is a Co map of the Si pillars and corresponding $CoSi_2$ regions shown in FIG. 4D. FIGS. 4E and 4F further illustrate that the $CoSi_2$ regions had good uniformity, and that each of the $CoSi_2$ regions was substantially confined within a lateral cross-sectional area defined by the sidewalls of the Si pillars.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, equivalents, and alternatives falling within the scope of the present disclosure as defined by the following appended claims and their legal equivalents.

What is claimed is:

1. An array of silicon structures, comprising:
   a silicon base;
   silicon pillars longitudinally extending from the silicon base and each exhibiting a metal silicide region at a longitudinal extremity thereof, the metal silicide region of each of the silicon pillars confined within a lateral cross-sectional area less than or equal to about 3600 nm$^2$ defined by sidewalls of each of the silicon pillars; and
   other silicon pillars each having another metal silicide region confined within a lateral cross-sectional area of less than or equal to about 9000 nm$^2$ defined by sidewalls of each of the other silicon pillars, a group of four of the silicon pillars separated from another group of four of the silicon pillars by one of the other silicon pillars.

2. The array of silicon structures of claim 1, wherein the metal silicide region comprises CoSi$_2$.

3. The array of silicon structures of claim 1, wherein the lateral cross-sectional area is less than or equal to about 2704 nm$^2$.

4. The array of silicon structures of claim 1, wherein the lateral cross-sectional area is less than or equal to about 1024 nm$^2$.

5. The array of silicon structures of claim 1, further comprising a dielectric material laterally intervening between each of the silicon pillars.

6. An array of silicon structures, comprising:
   silicon pillars each having a metal silicide region at a longitudinal extremity thereof, the metal silicide region of at least one of the silicon pillars confined within a lateral cross-sectional area defined by sidewalls of the at least one of the silicon pillars and having a lower end substantially coplanar with a top surface of a dielectric material intervening between each of the silicon pillars, and the at least one of the silicon pillars further comprising:
      another region underlying the metal silicide region and comprising an n-type dopant; and
      an additional region between the metal silicide region and the another region and comprising a p-type dopant.

7. The array of silicon structures of claim 6, wherein a thickness of the metal silicide region of each of the silicon pillars is substantially equivalent to a height differential between a top surface of each of the silicon pillars and the top surface of the dielectric material.

8. The semiconductor device structure of claim 6, wherein the metal silicide region comprises CoSi$_2$.

9. A semiconductor device structure, comprising:
   a silicon base comprising a first dopant;
   a silicon structure having a first lateral cross-sectional area and comprising:
      a first region longitudinally adjacent the silicon base and comprising the first dopant;
      a second region longitudinally adjacent the first region and comprising a second dopant different than the first dopant; and
      a metal silicide region longitudinally adjacent the second region and confined within the lateral cross-sectional area of the silicon structure; and
   another silicon structure having a second lateral cross-sectional area greater than the first lateral cross-sectional area of the silicon structure and comprising:
      a lower region longitudinally adjacent the silicon base and comprising the first dopant;
      another region longitudinally adjacent the lower region and comprising a third dopant different than the first dopant and the second dopant; and
      another metal silicide region longitudinally adjacent the another region and confined within the second lateral cross-sectional area of the another silicon structure.

10. The semiconductor device structure of claim 9, wherein the silicon structure and the another silicon structure are laterally separated from one another by an isolation trench partially filled with a dielectric material.

11. The semiconductor device structure of claim 10, wherein lower boundaries of the metal silicide region of the silicon structure and the another metal silicide region of the another silicon structure are substantially coplanar with an upper surface of the dielectric material within the isolation trench.

12. The semiconductor device structure of claim 10, wherein lower boundaries of the metal silicide region of the silicon structure and another metal silicide region of the another silicon structure longitudinally extend beyond a plane defined by an upper surface of the dielectric material within the isolation trench.

13. The semiconductor device structure of claim 9, wherein a ratio of a width of the silicon structure to a width of the another silicon structure is within a range of from about 1:1.5 to about 1:3.0.

14. The semiconductor device structure of claim 9, wherein the first dopant comprises an n-type dopant, the second dopant comprises a p-type dopant, and the third dopant comprises an n+ type dopant.

15. The semiconductor device structure of claim 9, wherein the first lateral cross-sectional area is less than or equal to about 3600 nm$^2$.

16. The semiconductor device structure of claim 9, wherein the metal silicide region of the silicon structure exhibits compositional uniformity at a longitudinal centerline of the silicon structures and along longitudinal planes defined by sidewalls of the silicon structure.

17. The semiconductor device structure of claim 9, wherein the metal silicide region of the silicon structure exhibits thickness uniformity at a longitudinal centerline of the silicon structures and along longitudinal planes defined by sidewalls of the silicon structure.

* * * * *

UNITED STATES PATENT AND TRADEMARK OFFICE
CERTIFICATE OF CORRECTION

PATENT NO. : 9,224,807 B2  
APPLICATION NO. : 14/199519  
DATED : December 29, 2015  
INVENTOR(S) : Carla M. Lazzari and Enrico Bellandi Page 1 of 1

It is certified that error appears in the above-identified patent and that said Letters Patent is hereby corrected as shown below:

In the specification:

| | | |
|---|---|---|
| COLUMN 2, | LINE 56, | change "faulted over" to --formed over-- |
| COLUMN 5, | LINES 41-42, | change "lateral cross cross-sectional" to --lateral cross-sectional-- |
| COLUMN 7, | LINE 3, | change "predeteimined amount" to --predetermined amount-- |
| COLUMN 14, | LINE 40, | change "were foinied on" to --were formed on-- |

Signed and Sealed this
Twenty-third Day of August, 2016

Michelle K. Lee
*Director of the United States Patent and Trademark Office*